United States Patent [19]

Carter

[11] 4,216,389
[45] Aug. 5, 1980

[54] BUS DRIVER/LATCH WITH SECOND STAGE STACK INPUT

[75] Inventor: Ernest A. Carter, Austin, Tex.

[73] Assignee: Motorola, Inc., Schaumburg, Ill.

[21] Appl. No.: 945,740

[22] Filed: Sep. 25, 1978

[51] Int. Cl.² ............... H03K 3/281; H03K 3/353
[52] U.S. Cl. ...................... 307/247 R; 307/203; 307/238; 307/279
[58] Field of Search ............... 307/238, 247 R, 270, 307/279, 289, 291, DIG. 5, 203

[56] References Cited

U.S. PATENT DOCUMENTS

| 3,725,792 | 4/1973 | Kellogg | 307/289 X |
| 3,895,240 | 7/1975 | Kawagoe | 307/279 |
| 3,904,888 | 9/1975 | Griffin et al. | 307/279 X |
| 3,959,781 | 5/1976 | Mehta et al. | 307/279 X |
| 4,063,117 | 12/1977 | Langesen | 307/270 |
| 4,146,802 | 3/1979 | Moench | 307/279 |

OTHER PUBLICATIONS

McDonald, "Multivibrator"; *IBM Tech. Discl. Bull.;* vol. 16, No. 8, pp. 2515; 1/1974.

Anderson, "Address Encoding Circuit"; *IBM Tech. Discl. Bull.;* vol. 17, No. 3, pp. 796-797; 8/1974.

*Primary Examiner*—Larry N. Anagnos
*Attorney, Agent, or Firm*—Joe E. Barbee

[57] ABSTRACT

A latching circuit is disclosed having series connected first and second stage MOSFET devices within a first inverter circuit. An output signal provided at the upper node of the series connected devices is coupled by a feedback MOSFET to the input of a second MOSFET inverter. The output of the second MOSFET inverter is coupled to the gate of the first series connected MOSFET device while the input signal to be latched is coupled to the gate of the second of the series connected MOSFET devices. The lower output node of the series connected MOSFET devices is used to provide an output signal to a data bus so that the logic state stored by the latching circuit can be accessed. The latching circuit is controlled by timing signals such that the output signal provided by the lower node is in the proper logic state whenever the latching circuit is to be coupled to the data bus.

12 Claims, 2 Drawing Figures

BUS DRIVER/LATCH WITH SECOND STAGE STACK INPUT

CROSS REFERENCES TO RELATED APPLICATIONS

1. "Architecture for Data Processor" invented by George Chamberlin, bearing Ser. No. 946,222, filed on even date herewith and assigned to the same assignee as named herein.
2. "Microprocessor Having Instruction Fetch and Execution Overlap" invented by George Chamberlin, bearing Ser. No. 946,221, filed on even date herewith and assigned to the same assignee as named herein.
3. "Real Time Capture Registers for Data Processor" invented by George Chamberlin, bearing Ser. No. 945,737, filed on even date herewith and assigned to the same assignee as named herein.
4. "Microprocessor Having Multiply/Divide Circuitry" invented by George Chamberlin, bearing Ser. No. 945,736, filed on even date herewith and assigned to the same assignee as named herein.
5. "Incrementor With Common Precharge Enable and Carry-In Signal" invented by Ernest Carter and Anthony Kouvoussis, bearing Ser. No. 945,738, filed on even date herewith and assigned to the same assignee as named herein.

BACKGROUND OF THE INVENTION

1. Field of the Invention

This invention relates generally to digital logic circuits and more particularly, to a MOSFET latching circuit.

2. Description of the Prior Art

Latching circuits are commonly used within larger digital circuits for monitoring the status of an input signal. The latching circuit is initialized to a first logic state while the input signal is in the passive state. At a later time, the input signal may switch from the passive to an active state, at which time the latching circuit switches to a logic state opposite to that from which it was initialized. The latching circuit now "remembers" that the input signal was in its active state even if the input signal subsequently returns to the passive state.

Often a latching circuit consists of a first logic circuit and a second logic circuit. The first logic circuit has two inputs, a first for receiving the input signal to be monitored, and the second for receiving a feedback signal. The output of the first logic circuit is typically coupled to the input of the second logic circuit, and the output of the second logic circuit typically provides the feedback signal.

In a particular application, it was desired to have active and passive states of the input signal corresponding to voltage signals having magnitudes of 0 volts and +5 volts, respectively. The first logic circuit can be a series connected structure (e.g., a NAND gate) such that the occurrence of the active state of the input signal (0 volts) will block current from flowing in the series connected structure. Also in this particular circuit application, it was desired to provide an output signal having a voltage of magnitude 0 volts immediately following the initialization of the latching circuit, and switching to a magnitude of +5 volts when the active state of the input signal is detected and latched. A further constraint on this circuit application is that the output of the latching circuit must be capable of transmitting the output signal to a highly capacitive data bus which is precharged to a positive voltage. Thus it is important for the latching circuit to provide a low impedance path to ground potential to provide efficient discharging of the data bus.

Prior art circuitry suggests several alternatives for complying with the constraints imposed upon this circuit application. A first alternative is the addition of a third logic circuit, for example an inverter circuit, having an input coupled to the output of the second logic circuit and an output suitable for driving a data bus. However the additional components required to form this third logic circuit require additional chip area if the latching circuit is fabricated as a monolithic integrated circuit. A second alternative suggested by the prior art is to employ relatively large series connected devices within the first logic circuit such that the total series impedance of first and second series connected devices is small enough to efficiently discharge the data bus. However the need for larger devices again increases the chip area consumed by the latching circuit if the latching circuit is fabricated as an integrated circuit. Increased chip area necessarily results in a smaller number of good integrated circuits per processed wafer and therefore higher cost per integrated circuit. Thus it will be appreciated that a latching circuit which fulfills the aforementioned circuit design constraints without increasing the required chip area to fabricate the latching circuit is a significant improvement over the prior art.

SUMMARY OF THE INVENTION

It is an object of the present invention to provide a latching circuit suitable for efficiently driving a precharged data bus and which is responsive to an active-low input signal for providing a high output level to the data bus.

It is another object of the present invention to provide a latching circuit having an output terminal which provides a relatively low impedance path to a source of ground potential without requiring large device sizes or additional components.

In accordance with these and other objects, the present invention relates to a latching circuit for storing a binary logic state and includes a first logic circuit having first and second input terminals and first and second output terminals, a second logic circuit having an input terminal and an output terminal, and a coupling circuit connected between the second output terminal of the first logic circuit and the input terminal of the second logic circuit. The output terminal of the second logic circuit provides an inverted feedback signal to the first input terminal of the first logic circuit. The second input terminal of the first logic circuit receives an input signal which determines the binary logic state stored by the latching circuit. The second output terminal of the first logic circuit provides a feedback signal which corresponds to the binary logic state stored by the latching circuit, and this feedback signal is presented to the input of the second logic circuit by the coupling circuit. The first output terminal of the first logic circuit provides an output signal corresponding to the binary logic state stored by the latching circuit. In the preferred embodiment, the first output terminal is selectively coupled to a digital bus for transmitting the output signal to the digital bus, and input circuitry coupled to the second input terminal of the first logic circuit ensures that the first output terminal is enabled when the output signal is transmitted to the digital bus.

DESCRIPTION OF THE PREFERRED EMBODIMENT

During the following recitation of circuit structure of the latching circuit, it should be recognized that a MOSFET (metal-oxide semiconductor field effect transistor) is a bilateral active circuit element having two main electrodes, a source and a drain, which are interchangeable, depending on the relative voltages therebetween, and a gate electrode. For a more complete description of MOSFETs, see "Physics and Technology of Semiconductor Devices", A. S. Grove, John Wiley and Sons, Inc., New York, 1967.

Figure 1:
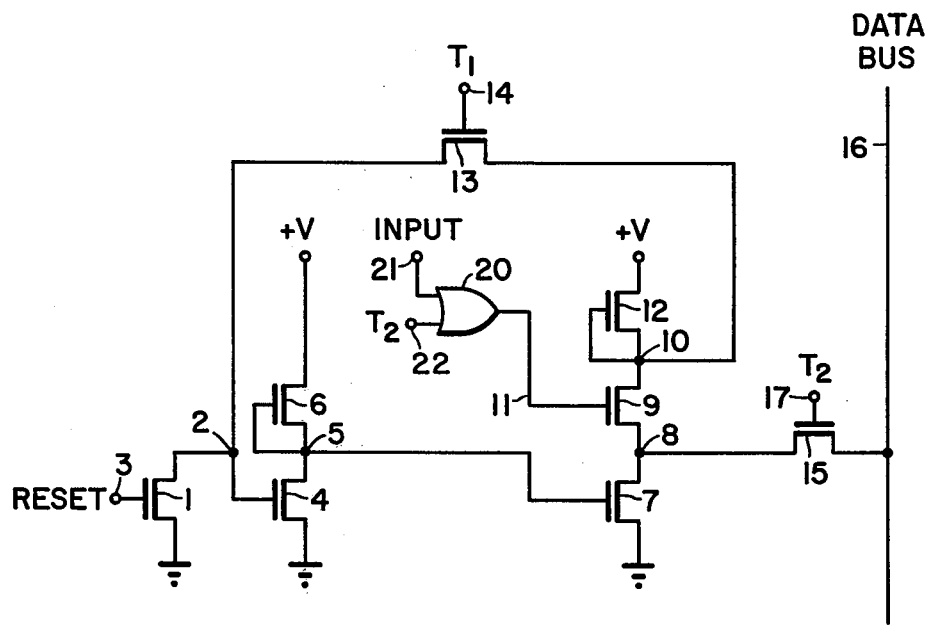
FIG. 1 is a circuit diagram of a latching circuit according to a preferred embodiment of the invention.

In FIG. 1, MOSFET device 1 is an n-channel enhancement mode device and is coupled between node 2 and a source of ground potential. The gate terminal of MOSFET device 1 is coupled to a reset signal by terminal 3. When the reset signal is at a voltage near ground potential, MOSFET device 1 is cut off and presents a high impedance to node 2. However when the reset signal is at a positive voltage MOSFET device 1 is conductive and node 2 is shorted to ground. Thus MOSFET device 1 provides a means for initializing the latching circuit which will be further explained hereinafter.

MOSFET device 4 is coupled between node 5 and ground potential. The gate terminal of MOSFET 4 is coupled to node 2 such that node 5 is conductively coupled to ground potential when node 2 is at a positive voltage. MOSFET device 6 is an n-channel depletion mode device coupled between a positive supply voltage and node 5 and serves as a load impedance. MOSFET devices 4 and 6 form a MOSFET inverter circuit having an input terminal corresponding to node 2 and an output terminal corresponding to node 5.

Node 5 is also coupled to the gate of MOSFET device 7 which is shown coupled between node 8 and ground potential. MOSFET device 9 is coupled between node 10 and node 8 and has its gate terminal coupled to conductor 11. MOSFET device 12 is a depletion mode device and is coupled between the positive supply voltage and node 10. Depletion mode MOSFET device 12 serves as a load impedance for series connected MOSFET devices 7 and 9, which together form a two-stage inverter or NAND circuit. The two-stage inverter circuit has a first input terminal corresponding to the gate terminal of MOSFET device 7, and a second input terminal corresponding to the gate terminal of MOSFET device 9. The two-stage inverter circuit also has a first output terminal corresponding to node 8 and a second output terminal corresponding to node 10.

MOSFET device 13 acts as a switch for selectively coupling node 10 to node 2 under the control of timing signal $T_1$. The gate terminal of MOSFET device 13 is coupled to timing signal $T_1$ by terminal 14 such that the feedback signal generated at node 10 is conductively coupled to node 2 when $T_1$ is at a positive voltage. During the time that $T_1$ is at a high level (positive voltage), MOSFET device 13 is operative to charge or discharge node 2 in accordance with the voltage generated by node 10. When $T_1$ returns to the low level, MOSFET device 13 is cut off and the voltage on node 2 is dynamically stored on the gate of MOSFET device 4 until such time as $T_1$ returns to the high level.

MOSFET device 15 is coupled between node 8 and data bus 16 and has its gate terminal coupled to timing signal $T_2$ via terminal 17. For purposes of illustration, terminal 17 is shown coupled directly to timing signal $T_2$; it will be understood by those skilled in the art that timing signal $T_2$ can be gated with various logic signals to provide a control signal to be coupled to the gate of MOSFET device 15 such that the latching circuit is coupled to data bus 16 only at desired times rather than during each occurrence of timing signal $T_2$. An example of such an application may be found in copending application "Real Time Capture Registers for Data Processor" invented by George Chamberlin, bearing Ser. No. 945,737, filed on even date herewith and assigned to the assignee of the present invention.

The input signal to which the latching circuit responds is received at input terminal 21, which is shown as being coupled to a first input of logical "OR" gate 20. A second input of logic gate 20 is coupled to timing signal $T_2$ by terminal 22, and the output of logic gate 20 is coupled to conductor 11. The output of logic gate 20 is a high level or a logic "1" when either input terminal 21 is at a high level or timing signal $T_2$ is at a high level, or if both are at a high level. For the ease of illustration, the input circuit is shown merely as a logical OR gate; a more detailed description of this input circuit may be found in copending application Ser. No. 945,737 mentioned above. In any event, the gate terminal of MOSFET device 9 is at a high level whenever timing signal $T_2$ is at a high level, while the voltage of the gate terminal of MOSFET device 9 corresponds to the voltage level of input terminal 21 at all other times.

Figure 2:
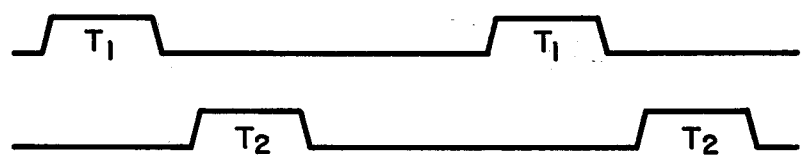
FIG. 2 is a timing diagram showing waveforms for first and second timing signals.

The operation of the preferred embodiment of the invention shown in FIG. 1 will now be described with the help of the timing diagram shown in FIG. 2. It will be assumed that during or prior to the first occurrence of timing signal $T_1$ shown in FIG. 2, the reset voltage signal coupled to terminal 3 is momentarily switched to a high logic level. MOSFET device 1 is then conductive and couples node 2 to ground potential. With node 2 at ground potential, MOSFET device 4 is cutoff, and node 5 is pulled up towards the positive supply voltage by depletion mode MOSFET device 6. With a high level present at node 5, MOSFET device 7 is conductive and couples node 8 to ground potential. If it is assumed that the input signal received by input terminal 21 is currently in the passive state (a high level), then the gate terminal of MOSFET device 9 is at a positive voltage, and MOSFET device 9 is also conductive. Thus node 10 is also pulled low to ground potential.

If the reset voltage signal coupled to terminal 3 is allowed to return to a low logic level, MOSFET device 1 will be cutoff. If this occurs when timing signal $T_1$ is at a low level voltage, then node 2 will be floating but will remain at a low level sufficient to maintain MOSFET device 4 in a cutoff condition until timing signal $T_1$ switches to a high level voltage. Those skilled in the art will appreciate that node 2 can dynamically store a voltage level for a period of time. When $T_1$ switches to a high level voltage, MOSFET device 13 is conductive and couples the ground potential at node 10 to node 2, thereby reinforcing the low logic level (ground potential) orignally stored on node 2 by reset MOSFET device 1.

At the end of the first $T_1$ pulse, node 2 has been discharged to ground potential, which maintains MOSFET device 4 in a cutoff condition even after MOSFET device 13 becomes cut off as $T_1$ returns to a low level.

During the first occurrence of timing signal $T_2$, MOSFET device 9 is maintained conductive and MOSFET device 15 is enabled for coupling the output terminal of the latching circuit (node 8) to the data bus. Data bus 16 is precharged to a positive voltage level during the occurrence of timing signal $T_1$, and the positive charge previously stored on data bus 16 must be discharged to ground potential through MOSFET devices 15 and 7. One of the prior art alternative circuits hereinbefore discussed would have required that the data bus be discharged from node 10 rather than node 8, which would have required that the data bus be discharged through a series path of three MOSFET devices rather than two MOSFET devices. The conductance of a MOSFET device may be expressed as a function of the ratio of the width of the device channel to the length of the channel. In the preferred embodiment, MOSFET device 7 has a conductance characterized by a ratio of 20, MOSFET device 9 is characterized by a ratio of 6, and MOSFET device 15 is characterized by a ratio of 10. If the prior art alternative circuit previously mentioned had been used, then MOSFET devices 7 and 9 would each need to be characterized by a conductance ratio of 40 in order to maintain the degree of conductance achieved by the preferred embodiment. Thus MOSFET device 7 would need to be twice as large, and MOSFET device 9 would need to be roughly seven times as large. Therefore, it will be appreciated that the chip area saved by the present invention is significant.

Following the first occurrence of timing signal $T_2$, let it be assumed that the input signal applied to input terminal 21 goes to a low logic level (the active state). Because timing signal $T_2$ is also at a low level, the gate terminal of MOSFET device 9 is now at a low level and MOSFET device 9 is cut off. Node 10 is then pulled toward the positive supply voltage by depletion mode MOSFET device 12. On the second occurrence of timing signal $T_1$, MOSFET device 13 is enabled and the positive voltage level at node 10 is coupled to node 2 which allows MOSFET device 4 to be conductive. Node 5 is then pulled to a low logic level which results in MOSFET device 7 being cut off. At this point in time, node 8 is floating since both MOSFET device 7 and MOSFET device 9 are cut off. However, as timing signal $T_2$ again pulses to a high level, the gate terminal of MOSFET device 9 is again taken to a high level, allowing MOSFET device 9 to be conductive. With $T_2$ at a high level, node 8 is again coupled to the data bus 16 which is charged towards the positive supply voltage through MOSFET devices 12, 9, and 15. Because the data bus was again precharged to a positive voltage during the preceding $T_1$ timing signal pulse, the output circuit is capable of maintaining the data bus at the the positive precharged voltage.

While the invention has been described with reference to a preferred embodiment, the description is for illustrative purposes and is not to be construed as limiting the scope of the invention. Various modifications and changes may occur to those skilled in the art without departing from the true spirit and scope of the invention as defined by the appended claims.

What is claimed is:

1. A latching circuit for storing a binary logic state comprising:

(a) first means having a first and a second input terminal and having a first and a second output terminal, said first input terminal being for receiving an inverted feedback signal, said second input terminal being for receiving an input signal to be latched by said latching circuit, said first output terminal being for providing an output signal corresponding to the binary logic state stored by the latching circuit, and said second output terminal providing a feedback signal corresponding to the binary logic state stored by said latching circuit, (b) second means having an input terminal and an output terminal, the input terminal being for receiving the feedback signal, and the output terminal being coupled to the first input terminal of said first means for providing said inverted feedback signal, and (c) first controllable coupling means coupled between the second output terminal of said first means and the input terminal of said second means for coupling the feedback signal to said second means.

2. A latching circuit as recited in claim 1 wherein said latching circuit is capable of being coupled to a reference supply voltage, said first means being suitable for providing a first conductive path between the first output terminal and the reference supply voltage and being suitable for providing a second conductive path between the second output terminal and the reference supply voltage, the first conductive path having a lower impedance than the second conductive path.

3. A latching circuit as recited in claim 2 wherein said latching circuit comprises second coupling means coupled to the first output terminal, said second coupling means coupling the output signal to a digital bus.

4. A latching circuit as recited in claim 3 wherein said second coupling means comprises first switch means responsive to a first timing signal for selectively coupling the first output terminal to the digital bus.

5. A latching circuit as recited in claim 4 further comprising input means coupled to the second input teminal for providing the input signal, said input means being responsive to the first timing signal such that the first output terminal is enabled whenever said second coupling means couples the first output terminal to the digital bus.

6. A latching circuit as recited in claim 5 further comprising reset means coupled to the input terminal of said second means for initializing the binary logic state stored by said latching circuit.

7. A latching circuit as recited in claim 6 wherein said first controllable coupling means comprises second switch means responsive to a second timing signal for selectively coupling the second output terminal to the input terminal of the second means.

8. A latching circuit for storing a binary logic state comprising:

(a) a first MOSFET device having source, drain, and gate terminals, the source being coupled to a first voltage supply conductor for receiving a first supply voltage, (b) a second MOSFET device having source, drain, and gate terminals, the source being coupled to the drain of the first MOSFET device, (c) a third MOSFET device for providing a load impedance, said third MOSFET device being coupled between the drain of said second MOSFET device and a second voltage supply conductor for receiving a second supply voltage, (d) a MOSFET inverter coupled between the first and second voltage supply conductors and having an input and an output terminal, the output terminal being coupled to the gate of said first MOSFET device, (e) means for controllably coupling the drain of said second MOSFET device to the input terminal of said MOSFET inverter, (f) input means coupled to the gate of said second MOSFET device for receiving an input signal to be latched by said latching circuit, and (g) output means coupled to the drain of said first MOSFET device for providing an output signal which corresponds to the binary logic state stored by said latching circuit.

9. A latching circuit as recited in claim 8 wherein said output means comprises switch means responsive to a timing signal for selectively coupling the drain of said first MOSFET device to a digital bus.

10. A latching circuit as recited in claim 9 wherein said input means is responsive to the timing signal for enabling the second MOSFET device and for conductively coupling the drain of said first MOSFET device to said third MOSFET device.

11. A latching circuit as recited in claim 10 further comprising reset means coupled to the input of said MOSFET inverter for initializing the binary logic state stored by said latching circuit.

12. A latching circuit as recited in claim 11 wherein said third MOSFET is a depletion mode device having source, drain, and gate terminals, the source and the gate being coupled to the drain of said second MOSFET device, and the drain being coupled to the second voltage supply conductor.

* * * * *